United States Patent
Lee et al.

(10) Patent No.: US 7,894,265 B2
(45) Date of Patent: Feb. 22, 2011

(54) NON-VOLATILE MEMORY DEVICE AND OPERATION METHOD OF THE SAME

(75) Inventors: Tae-hee Lee, Yongin-si (KR); Won-joo Kim, Hwaseong-si (KR); Yoon-dong Park, Yongin-si (KR); June-mo Koo, Seoul (KR); Suk-pil Kim, Yongin-si (KR); Tae-eung Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 286 days.

(21) Appl. No.: 12/081,679

(22) Filed: Apr. 18, 2008

(65) Prior Publication Data

US 2009/0091975 A1    Apr. 9, 2009

(30) Foreign Application Priority Data

Oct. 5, 2007    (KR) ................... 10-2007-0100344

(51) Int. Cl.
G11C 5/06    (2006.01)
G11C 16/04    (2006.01)
G11C 16/10    (2006.01)
G11C 16/26    (2006.01)

(52) U.S. Cl. ..................... 365/185.17; 365/185.05; 365/185.18; 365/185.13

(58) Field of Classification Search ............ 365/185.05, 365/185.06, 185.11, 185.13, 185.17, 185.18
See application file for complete search history.

(56) References Cited

U.S. PATENT DOCUMENTS

| | | | | |
|---|---|---|---|---|
| 5,528,537 A | * | 6/1996 | Lee et al. ............... | 365/185.11 |
| 6,650,567 B1 | * | 11/2003 | Cho et al. .............. | 365/185.17 |
| 7,675,779 B2 | * | 3/2010 | Kim et al. .............. | 365/185.17 |
| 2005/0073001 A1 | * | 4/2005 | Kamigaichi et al. ........ | 257/315 |
| 2007/0257307 A1 | * | 11/2007 | Chen ......................... | 257/324 |
| 2008/0144378 A1 | * | 6/2008 | Park et al. .............. | 365/185.05 |

FOREIGN PATENT DOCUMENTS

| | | |
|---|---|---|
| KR | 10-2007-0012127 | 1/2007 |
| KR | 10-0673020 | 1/2007 |
| WO | WO 2005/078733 | 1/2005 |
| WO | WO 2006/124525 | 5/2006 |

* cited by examiner

Primary Examiner—J. H. Hur
(74) Attorney, Agent, or Firm—Harness, Dickey & Pierce, P.L.C.

(57) ABSTRACT

The non-volatile memory device may include one or more main strings each of which may include first and second substrings which may separately include a plurality of memory cell transistors; and a charge supply line which may be configured to provide charges to or block charges from the first and second substrings of each of the main strings, wherein each of the main strings may include a first ground selection transistor which may be connected to the first substring; a first substring selection transistor which may be connected to the first ground selection transistor; a second ground selection transistor which may be connected to the second substring; and a second substring selection transistor which may be connected to the second ground selection transistor. A method of programming a target cell of the memory device includes activating selection transistors connected to a main string and substring of the target cell.

22 Claims, 7 Drawing Sheets

NON-VOLATILE MEMORY DEVICE AND OPERATION METHOD OF THE SAME

PRIORITY STATEMENT

This application claims priority under 35 U.S.C. §119 to Korean Patent Application No. 10-2007-0100344, filed on Oct. 5, 2007, in the Korean Intellectual Property Office, the entire contents of which are incorporated herein by reference.

BACKGROUND

1. Field

Example embodiments relate to a non-volatile memory device, and more particularly, to a non-volatile memory device that operates without using a channel boosting technology.

2. Description of Related Art

A not- and NAND type non-volatile memory device may include memory transistors arranged on NAND strings. Word lines may be coupled with the memory transistors so as to cross the NAND strings. Thus, in this NAND type non-volatile memory device, data may need to be inhibited from being programmed on memory transistors arranged on unselected NAND strings.

According to conventional art, programming of some NAND strings may be inhibited by using a channel boosting technology. Channel boosting may include reducing programming potentials to be applied to memory transistors by applying a high boosting voltage to channels of unselected NAND strings.

However, a boosting voltage may damage outermost memory transistors so as to reduce operation reliability of a non-volatile memory device. For example, a hot carrier incurred by gate induced drain leakage (GIDL) may disturb the memory transistors. Accordingly, programs and path windows of the memory transistors may be reduced and a short channel effect may occur when a read operation is performed.

SUMMARY

Example embodiments may provide a non-volatile memory device that may operate without using a channel boosting technology.

Example embodiments may provide a non-volatile memory device which may include one or more main strings each of which may comprise first and second substrings which may separately comprise a plurality of memory cell transistors; and a charge supply line which may be configured to provide charges to or block charges from the first and second substrings of each of the main strings, wherein each of the main strings may include a first ground selection transistor which may be connected to the first substring; a first substring selection transistor which may be connected to the first ground selection transistor; a second ground selection transistor which may be connected to the second substring; and a second substring selection transistor which may be connected to the second ground selection transistor.

The non-volatile memory device may further include a first substring selection line which may be connected to a gate of the first substring selection transistor; and a second substring selection line which may be connected to a gate of the second substring selection transistor.

Source and drain regions may be formed on a semiconductor substrate between the memory cell transistors by fringe fields. The fringe fields may be formed by applying voltages to gates of the memory cell transistors.

The first and second substrings may form flash memory having a perpendicular structure. A bit line may be shared by the first and second substrings of each of the main strings.

The charge supply line may be a common source line.

Example embodiments may provide a method of programming a target memory cell transistor of the non-volatile memory device which may include turning on first and second ground selection transistors, which may be connected to a main string which may comprise the target memory cell transistor; turning on a substring selection transistor, which may be connected to a substring which may comprise the target memory cell transistor; and turning off another substring selection transistor, which may be connected to another substring which may not comprise the target memory cell transistor.

First and second ground selection transistors, which may be connected to another main string not including target memory cell transistor, may be turned off in order to inhibit programming of the other main string.

Example embodiments may provide a method of reading a target memory cell transistor of a non-volatile memory device which may include turning on first and second ground selection transistors, which may be connected to a main string comprising the target memory cell transistor; turning on a substring selection transistor, which may be connected to a substring comprising the target memory cell transistor; and turning off another substring selection transistor, which may be connected to another substring which may not comprise the target memory cell transistor.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
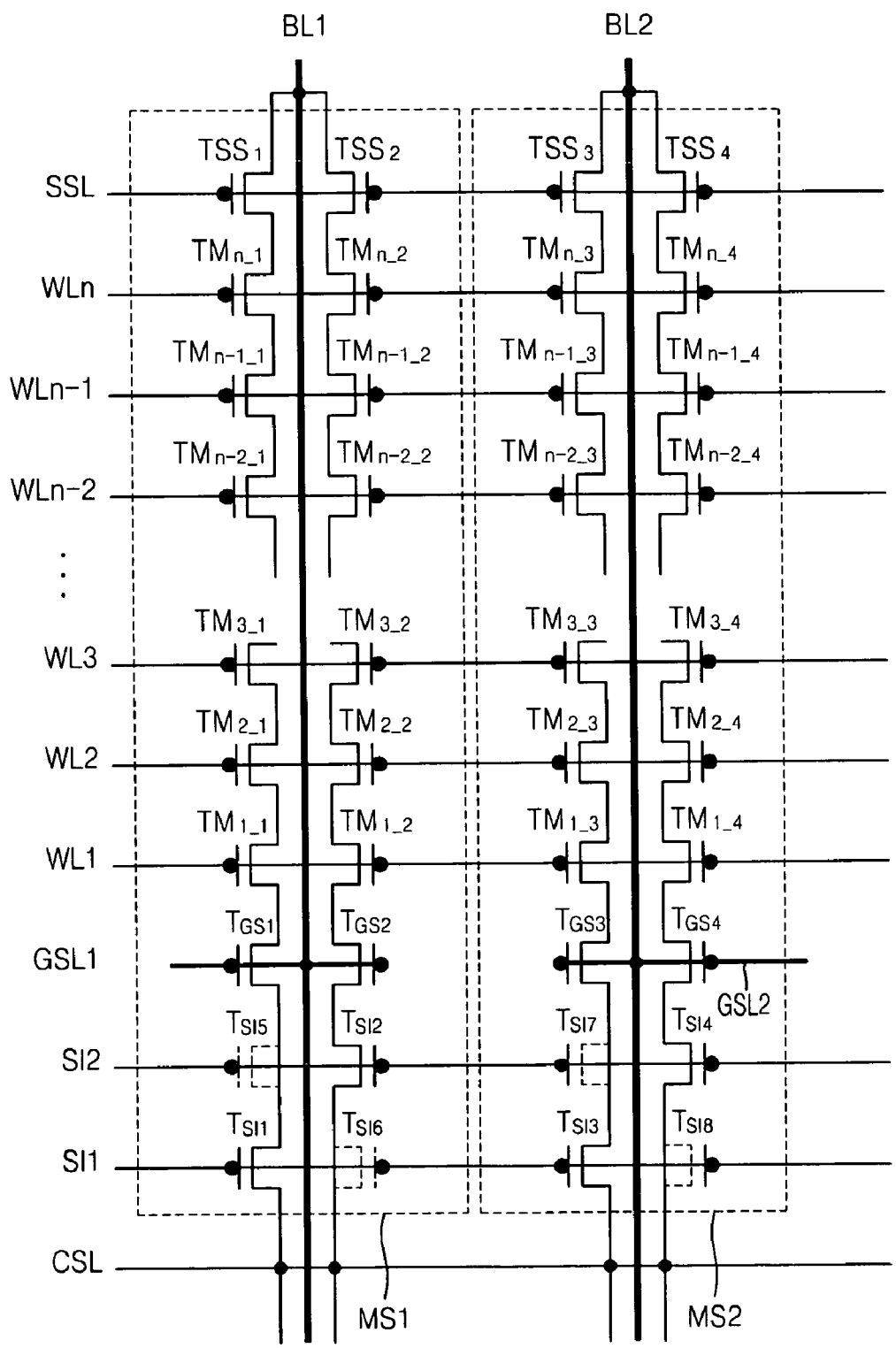
FIG. 1 is a circuit diagram of a non-volatile memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a circuit diagram of a non-volatile memory device according to example embodiments.

Referring to FIG. 1, the non-volatile memory device may include one or more main strings, for example first and second main strings MS1 and MS2, and a charge supply line CSL.

Each main string may include a plurality of substrings and each substring may include a plurality of memory cell transistors. For example, the first main string MS1 may include first and second substrings SS1 and SS2. First and second substrings SS1 and SS2 may include first memory cell transistors TM1_1 through TMn_1 and second memory cell transistors TM1_2 through TMn_2, respectively. The second main string MS2 may include first and second substrings SS3 and SS4. First and second substrings SS3 and SS4 may include first memory cell transistors TM1_3 through TMn_3 and second memory cell transistors TM1_4 through TMn_4, respectively. The charge supply line CSL may provide charges to or block charges from the first and second substrings SS1 through SS4 of the first and second main strings MS1 and MS2. The charge supply line CSL may be a common source line.

The first and second main strings MS1 and MS2 may respectively include first ground selection transistors TGS1 and TGS3, first substring selection transistors TSI1 and TSI3, second ground selection transistors TGS2 and TGS4, and second substring selection transistors TSI2 and TSI4. The first ground selection transistors TGS1 and TGS3 and the first substring selection transistors TSI1 and TSI3 may be respectively connected to the first substrings SS1 and SS3, and the second ground selection transistors TGS2 and TGS4 and the second substring selection transistors TSI2 and TSI4 may be respectively connected to the second substrings SS2 and SS4.

The non-volatile memory device may select one main string from among the first and second main strings MS1 and MS2 by using the first and second ground selection transistors TGS1 through TGS4, and may select one substring from among the first and second substrings SS1 through SS4 by using the first and second substring selection transistors TSI1 through TSI4. For example, by turning on the first and second ground selection transistors TGS1 and TGS2 of the first main string MS1, the first main string MS1 may be selected. By turning off the first and second ground selection transistors TGS3 and TGS4 of the second main string MS2, the second main string MS2 may not be selected. Also, by turning on the first substring selection transistor TSI1 of the first main string MS1, the first substring SS1 may be selected. By turning off the second substring selection transistor TSI2 of the first main string MS1, the second substring SS2 may not be selected. Accordingly, the non-volatile memory device according to example embodiments may provide an advantage in that a desired substring may be separately selected.

In order to separately select a substring, the non-volatile memory device may include first and second substring selection lines SI1 and SI2. The first substring selection line SI1 may be connected to the first substring selection transistor TSI1 and the second substring selection line SI2 may be connected to the second substring selection transistor TSI2. By controlling levels of voltages applied to the first and second substring selection lines SI1 and SI2, the first and second substring selection transistors TSI1 and TSI2 may be separately turned on or off. Accordingly, the first and second substrings SS1 and SS2 may be separately selected. For example, if 0V is applied to the first substring selection line SI1 and a supply voltage (Vcc) is applied to the second substring selection line SI2, the first substring selection transistor TSI1 may be turned off and the second substring selection transistor TSI2 may be turned on. Accordingly, the second substring SS2 may be selected.

In order to control the first and second ground selection transistors TGS1 through TGS4, the non-volatile memory device may include first and second ground selection lines GSL1 and GSL2. The first and second ground selection lines GSL1 and GSL2 may be respectively connected to gates of the first and second ground selection transistors TGS1 and TGS2, and gates of the first and second ground selection transistors TGS3 and TGS4. By controlling levels of voltages applied to the first and second ground selection lines GSL1 and GSL2, the first and second ground selection transistors TGS1 and TGS2 of the first main string MS1 may be turned on or the first and second ground selection transistors TGS3 and TGS4 of the second main string MS2 may be turned on. Accordingly, the first and second main strings MS1 and MS2 may be separately selected.

In the non-volatile memory device, the first and second ground selection lines GSL1 and GSL2 may be respectively connected to first and second bit lines BL1 and BL2. In this case, voltages applied to the first and second ground selection lines GSL1 and GSL2 may be respectively transmitted to the first and second bit lines BL1 and BL2 and thus voltage levels of the first and second ground selection lines GSL1 and GSL2 may be respectively the same as the voltage levels of the first and second bit lines BL1 and BL2. Accordingly, by controlling the voltage levels applied to the first and second bit lines BL1 and BL2, the first and second ground selection transistors TGS1 through TGS4, which may be connected to the first and second ground selection lines GSL1 and GSL2, may be controlled.

The non-volatile memory device may include first string selection transistors TSS1 and TSS3 and second string selection transistors TSS2 and TSS4. The first string selection transistors TSS1 and TSS3 may be respectively connected to the first substrings SS1 and SS3, and the second string selection transistors TSS2 and TSS4 may be respectively connected to the second substrings SS2 and SS4.

In the non-volatile memory device, the first and second substrings SS1 and SS2 may form flash memory having a perpendicular structure. Accordingly, the first bit line BL1 may be shared by the first and second substrings SS1 and SS2. For more information on the flash memory having a perpendicular structure, Korean Patent No. 0707200 may be referred and the disclosure of the patent may be included in the present invention.

If the non-volatile memory device includes the flash memory having a perpendicular structure, ground selection transistors connected to two substrings may be controlled by one bit line. For example, the first and second ground selection transistors TGS1 and TGS2, which may be connected to the first and second substrings SS1 and SS2, may be controlled by the first bit line BL1. Also, as described above, by using the first and second substring selection transistors TSI1 and TSI2, one of the first and second substrings SS1 and SS2, which may be connected to the first bit line BL1, may be selected.

Figure 2:
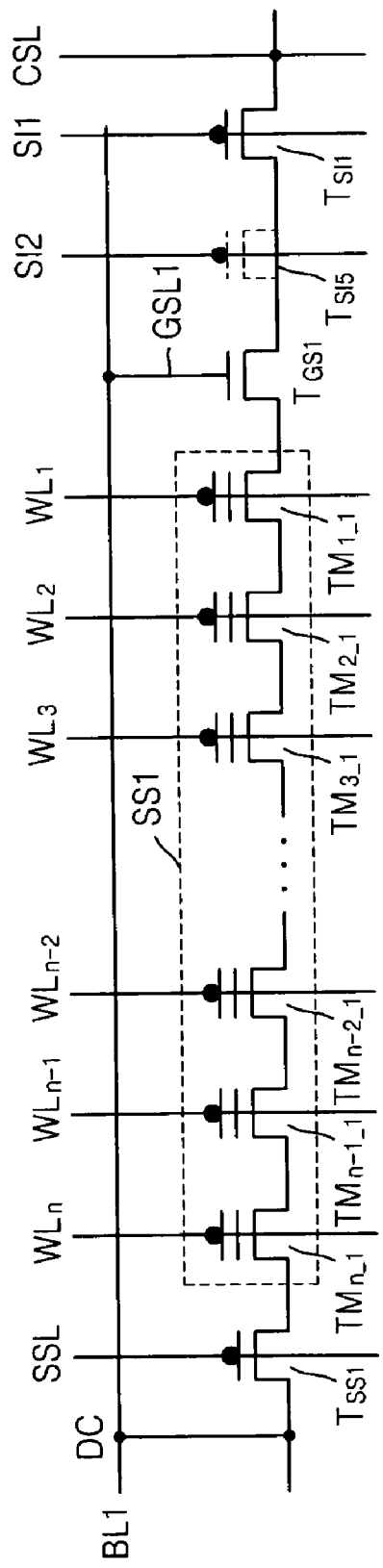
FIG. 2 is a circuit diagram of a portion of the non-volatile memory device illustrated in FIG. 1, according to example embodiments.

FIG. 2 is a circuit diagram of a portion of the non-volatile memory device illustrated in FIG. 1, according to example embodiments.

Figure 3:
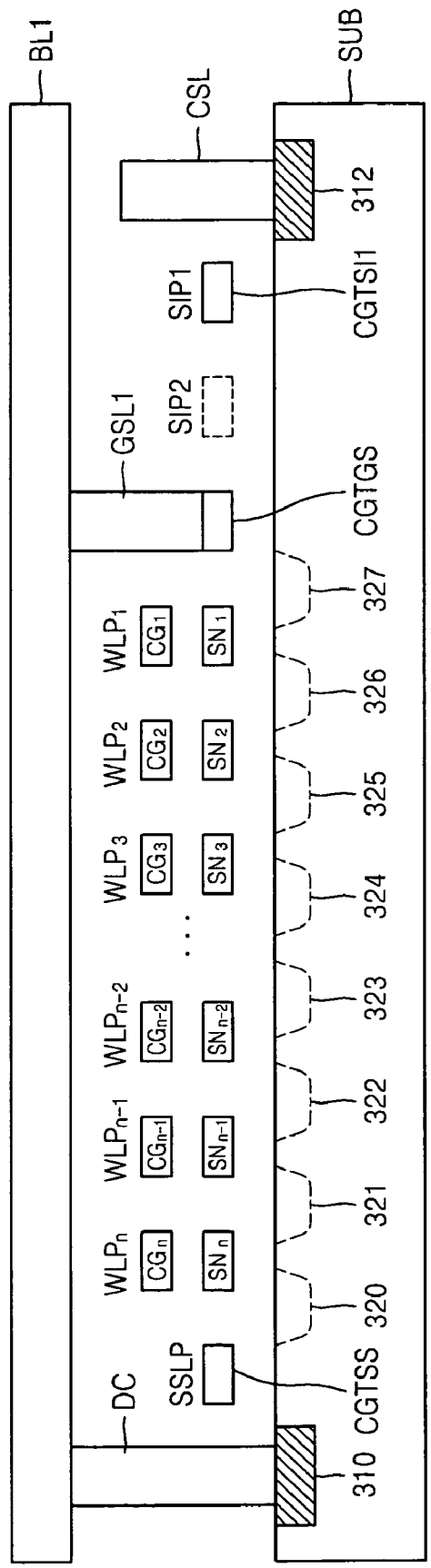
FIG. 3 is a cross-sectional view of a portion of the non-volatile memory device illustrated in FIG. 1, according to example embodiments.

FIG. 3 is a cross-sectional view of a portion of the non-volatile memory device illustrated in FIG. 1, according to example embodiments.

Figure 4:
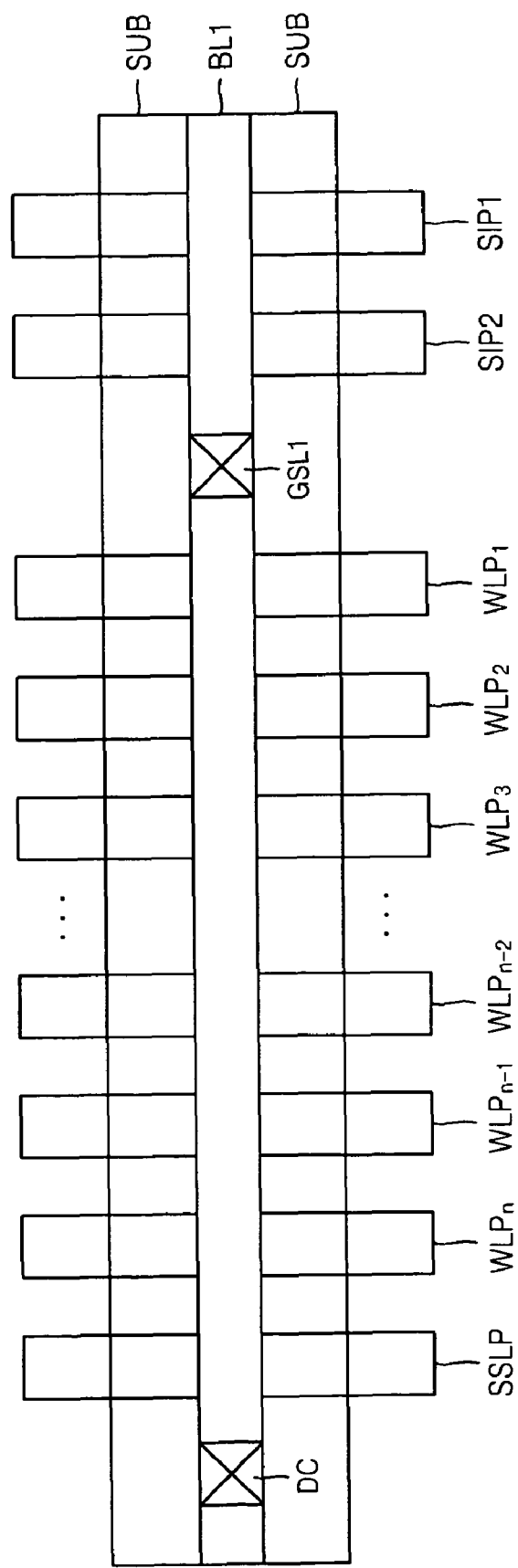
FIG. 4 is a plane view of a portion of the non-volatile memory device illustrated in FIG. 1, according to example embodiments.

FIG. 4 is a plane view of a portion of the non-volatile memory device illustrated in FIG. 1, according to example embodiments.

In FIGS. 2 through 4, the first substring SS1 which is illustrated in FIG. 1 and the first string selection transistor TSS1, the first ground selection transistor TGS1, and the first substring selection transistor TSI1 which are illustrated in FIG. 1 and may be connected to the first substring SS1, are illustrated.

First memory cell transistors TM1_1 through TMn_1 illustrated in FIG. 2 may have a flash transistor structure, and the first string selection transistor TSS1, the first ground selection transistor TGS1, and the first substring selection transistor TSI1 illustrated in FIG. 2 may have a metal-oxide-semiconductor (MOS) transistor structure. The flash transistor structure and the MOS transistor structure may be formed on a semiconductor substrate SUB as illustrated in FIGS. 3 and 4. That is, the first substring SS1, the first string selection transistor TSS1, the first ground selection transistor TGS1, and the first substring selection transistor TSI1 may be formed on a semiconductor substrate SUB. A portion of the semiconductor substrate SUB may provide conductive passages of charges. The semiconductor substrate SUB may include, for example, silicon, germanium, or silicon-germanium.

First memory cell transistors TM1_1 through TMn_1 illustrated in FIG. 2 may respectively include charge storage layers SN1 through SNn, control gate electrodes CG1 through CGn, and second source and drain regions 320~327 illustrated in FIG. 3. For example, a first memory cell transistor TM1_1 may be composed of a charge storage layer SN1, a control gate electrode CG1, and second source and drain regions 326 and 327. Charge storage layers SN1 through SNn and control gate electrodes CG1 through CGn may be separately stacked on the semiconductor substrate SUB. The control gate electrodes CG1 through CGn may be formed on the charge storage layers SN1 through SNn and may be separated by a blocking insulation layer (not shown). The charge storage layers SN1 through SNn may be used as floating gate layers or charge trap layers. Furthermore, a tunneling insulation layer (not shown) may be further formed between the semiconductor substrate SUB and the charge storage layers SN1 through SNn.

The control gate electrodes CG1 through CGn illustrated in FIG. 3 may be portions of word line patterns WLP1 through WLPn illustrated in FIG. 4. Also, the word line patterns WLP1 through WLPn may perform functions of word lines WL1 through WLn which are illustrated in FIGS. 1 and 2.

The first string selection transistor TSS1 and the first ground selection transistor TGS1 may have an MOS transistor structure.

The first string selection transistor TSS1 illustrated in FIG. 2 may include a gate electrode CGTSS, a first source and drain region 310, and a second source and drain region 320 on the semiconductor substrate SUB. The first source and drain region 310 may be a source region (or drain region), and the second source and drain region 320 may be a drain region (or source region) in the MOS transistor structure. The gate electrode CGTSS may be a portion of a string selection line pattern SSLP which may be included in a string selection line SSL.

The first ground selection transistor TGS1 illustrated in FIG. 2 may include a gate electrode CGTGS and a second source and drain region 327 on the semiconductor substrate SUB. The second source and drain region 327 may be a source region or a drain region in the MOS transistor structure.

The first substring selection transistor TSI1 illustrated in FIG. 2 may include a gate electrode CGTSI1, and a first source and drain region 312 on the semiconductor substrate SUB. The first source and drain region 312 may be a source region or a drain region in MOS transistor structure. The gate electrode CGTSI1 may be a portion of a substring selection line pattern SIP1 included in a substring selection line SI1.

Referring back to FIG. 1, the non-volatile memory device according to example embodiments may include first dummy substring selection transistors TSI5 and TSI7, and second dummy substring selection transistors TSI6 and TSI8. For example, referring to FIGS. 1, 3, and 4, a substring selection line pattern SIP2 functioning as a gate of a second substring selection transistor TSI2 may pass through an empty space between the first substring selection transistor TSI1 and the first ground selection transistor TGS1. A gate of a first dummy substring selection transistor TSI5 may be formed as a portion of the substring selection line pattern SIP2. A gate of a second dummy substring selection transistor TSI6 may be formed as a portion of the substring selection line pattern SIP1 that passes through an empty space between the second substring selection transistor TSI2 and a common source line CSL.

Referring to FIG. 3, the non-volatile memory device may include first source and drain regions 310 and 312. The first source and drain regions 310 and 312 may be formed by doping impurities on the semiconductor substrate SUB. For example, if the semiconductor substrate SUB has a first conductivity type, the first source and drain regions 310 and 312 may be formed of impurities having a second conductivity type that is opposite to the first conductivity type. Accordingly, the first source and drain regions 310 and 312 may be doped on the semiconductor substrate SUB by using a diode junction method.

Referring to FIG. 3, a bit line BL1 may be connected to a first source and drain region 310 of the semiconductor substrate SUB by using a direct contact plug (DC). The common source line CSL may be electrically connected to a first source and drain region 312 of the semiconductor substrate SUB.

The first source and drain regions 310 and 312 may be formed on the semiconductor substrate SUB outer sides of transistors. Accordingly, the first source and drain regions 310 and 312 may not be formed on the semiconductor substrate SUB between a control gate electrode CGn of a first memory cell transistor TMn_1, between the control gate electrodes CG1 through CGn of the first memory cell transistors TM1_1 through TMn_1 and the string selection line pattern SSLP of the first string selection transistor TSS1, and between a control gate electrode CG1 of the first memory cell transistor TM1_1 and the substring selection line pattern SIP1 of the first substring selection transistor TSI1.

On regions where first source and drain regions 310 and 312 are not formed, second source and drain regions 320 through 327 may be formed. The second source and drain regions 320 through 327 may be formed on the semiconductor substrate SUB between the control gate electrodes CG1 through CGn of the first memory cell transistors TM1_1 through TMn_1.

The second source and drain regions 320 through 327 may be formed selectively in accordance with an operation mode of the non-volatile memory device. For example, the second source and drain regions 320 through 327 may be formed in a program mode or a read mode of the non-volatile memory device, and the second source and drain regions 320 through 327 may not be formed in any other mode of the non-volatile memory device. The second source and drain regions 320 through 327 are indicated by dotted lines in FIG. 3 because they may be formed selectively.

The second source and drain regions 320 through 327 may be formed by fringe fields occurring due to a voltage applied to the control gate electrodes CG1 through CGn.

Figure 7:
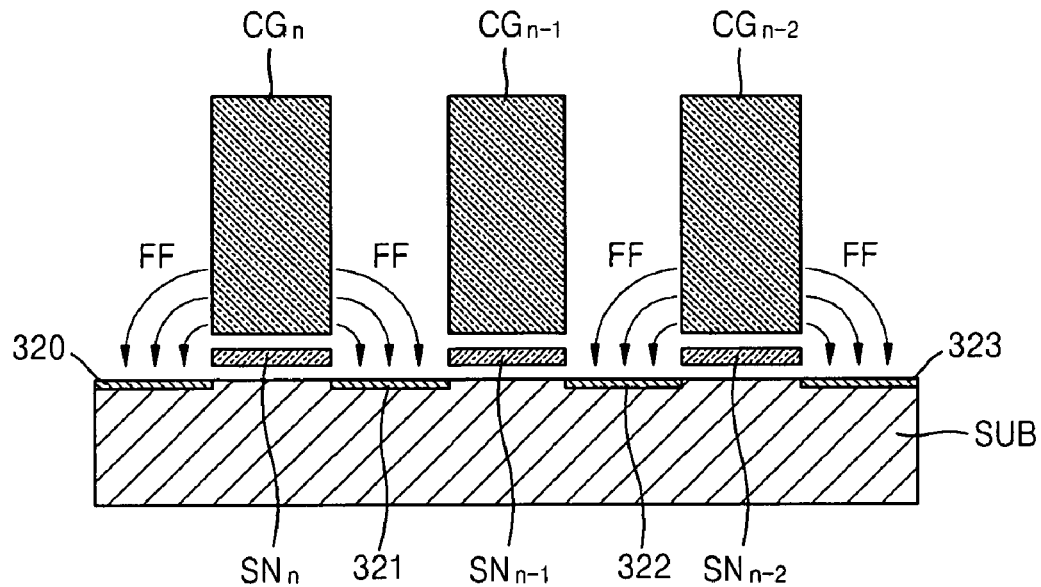
FIG. 7 is a cross-sectional view of the non-volatile memory device illustrated in FIG. 1 when fringe fields occur, according to example embodiments.

FIG. 7 is a cross-sectional view of the non-volatile memory device illustrated in FIG. 1 when fringe fields FF occur, according to example embodiments.

In FIG. 7, second source and drain regions 320 through 323 may be formed by the fringe fields FF.

Referring back to FIGS. 2 through 4, the second source and drain regions 320 through 327 may be inversion layers formed by a field effect and may be similar to channels. The second source and drain regions 320 through 327 may be formed only when a voltage is applied to control gate electrodes CG1 through CGn. In this point of view, the second source and drain regions 320 through 327 formed by a field effect may differ from the first source and drain regions 310 and 312 which are illustrated in FIG. 3 and are formed by doping impurities. For more information on the second source and drain regions 320 through 327 formed by a field effect, Korean Patent No. 0673020 may be referred and the disclosure of the patent may be included in the present invention.

The second source and drain regions 320 through 327 may be further formed between the control gate electrode CGn and the string selection line pattern SSLP of the first string selection transistor TSS1, and between the control gate electrode CG1 and the substring selection line pattern SIP1 of the first substring selection transistor TSI1. The second source and drain regions 320 through 327 may be conductive passages of charges during a program operation and a read operation of the non-volatile memory device.

Figure 8:
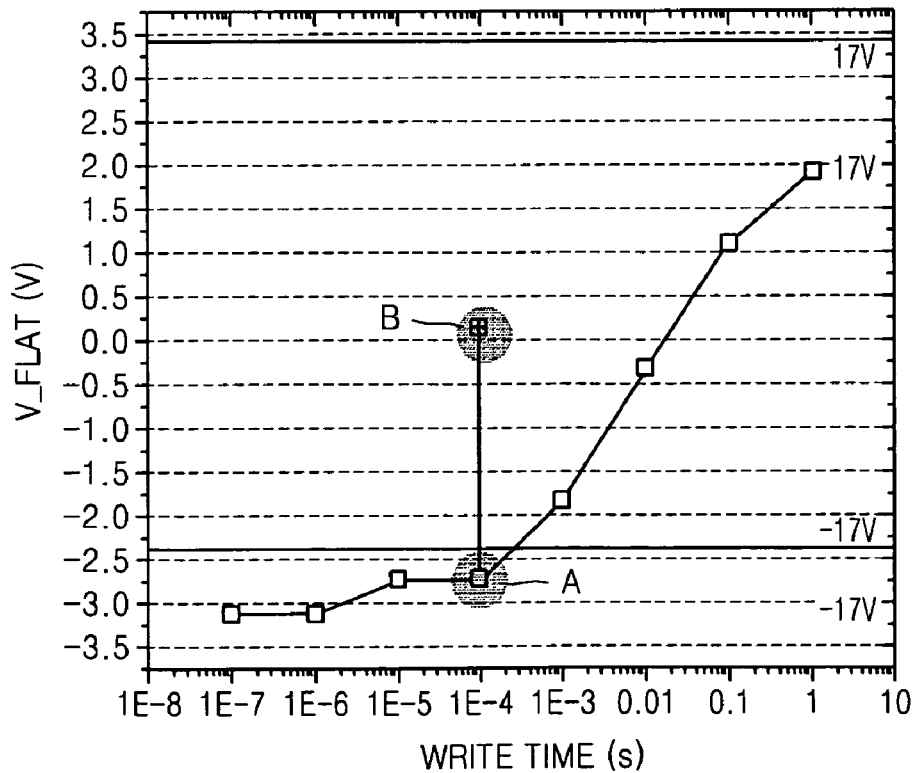
FIG. 8 is a graph showing operational characteristics of the non-volatile memory device illustrated in FIG. 1 when fringe fields occur, according to example embodiments.

FIG. 8 is a graph showing operational characteristics of the non-volatile memory device illustrated in FIG. 1 when fringe fields occur, according to example embodiments.

Referring to FIG. 8, programming characteristics in case A when free electrons do not exist in 15 μs through 20 μs illustrated in FIG. 3 differ from the programming characteristics in case B when free electrons exist in the second source and drain regions 320 through 327. A conventional non-volatile memory device having a NAND structure may use a step pulse programming method. In this case, a step pulse may have a hold time of approximately 15 μs through 20 μs.

In case A, a flat band voltage V_FLAT may rarely vary until a write time of approximately 100 μs. However, in case B, the flat band voltage V_FLAT may vary more than approximately 3V at the write time of approximately 100 μs, in comparison to case A. A variation of the flat band voltage V_FLAT may indicate a variation of a threshold voltage and thus may affect data programming. Thus, if a step pulse programming method having a conventional write time of 15 μs through 20 μs is used, the data may be rarely programmed in case A and may be programmed in case B.

Accordingly, if free electrons are provided to the second source and drain regions 320 through 327, a program operation may be enabled. However, if free electrons are not provided to the second source and drain regions 320 through 327, the program operation may be disabled. By using the above-described principle, the programming operation may be inhibited without applying a high channel boosting voltage.

For example, referring back to FIGS. 1 through 4, if data is to be programmed on the first memory cell transistors TM1_1 through TMn_1, free electrons may be provided from the common source line CSL to the second source and drain regions 320 through 327 by turning on the first ground selection transistor TGS1. Meanwhile, if data is to be inhibited from being programmed on the first memory cell transistors TM1_1 through TMn_1, free electrons may not be provided to the second source and drain regions 320 through 327 by turning off the first string selection transistor TSS1 and the first ground selection transistor TGS1.

Figure 5:
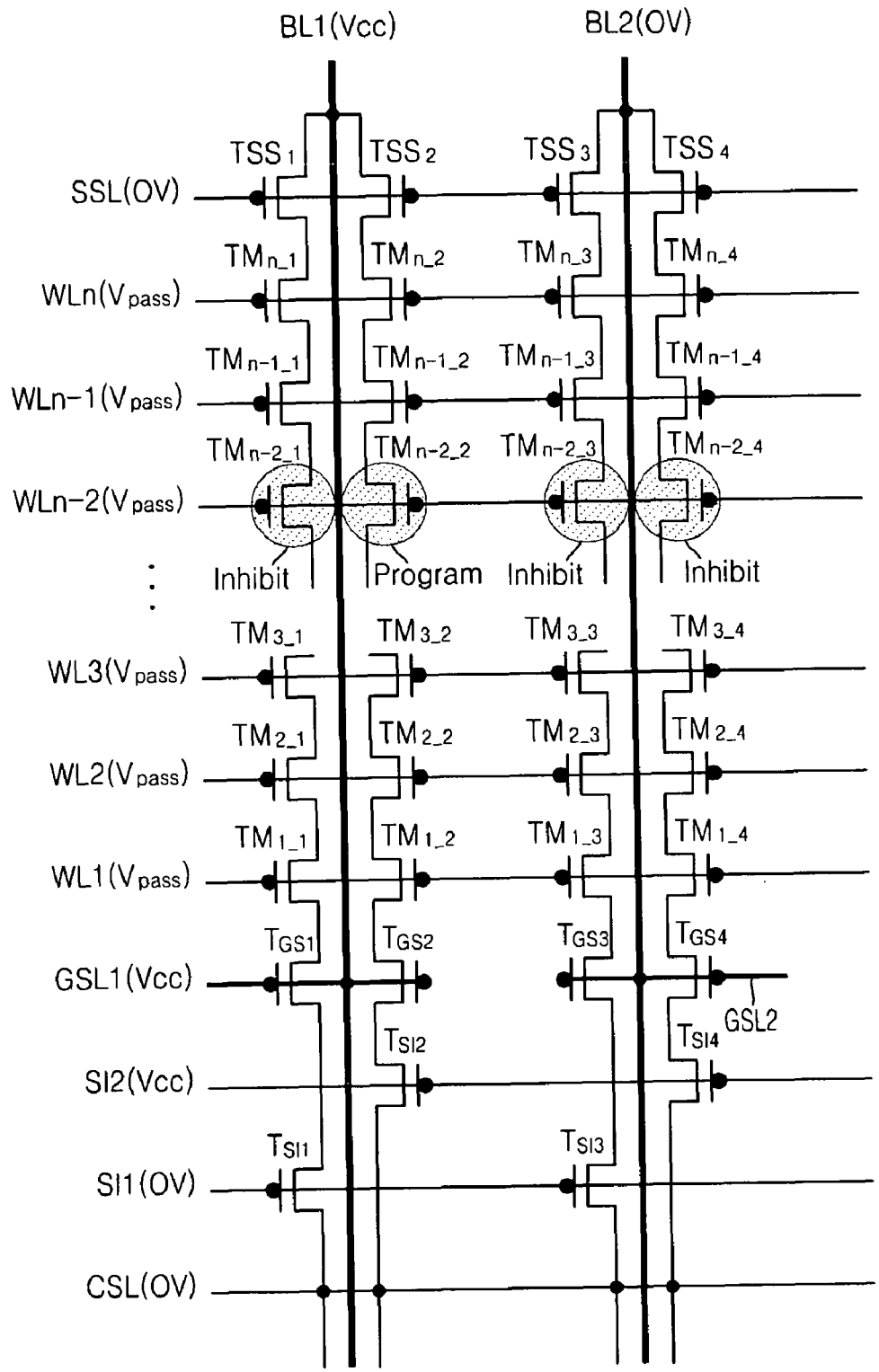
FIG. 5 is a circuit diagram for describing a program operation of the non-volatile memory device illustrated in FIG. 1, according to example embodiments.

FIG. 5 is a circuit diagram for describing a program operation of the non-volatile memory device illustrated in FIG. 1, according to example embodiments. FIG. 5 will be described in conjunction with FIG. 1.

In FIG. 5, it is assumed that a memory cell transistor TMn-2_2 is a target memory cell transistor to be programmed. In order to program the memory cell transistor TMn-2_2, the first and second ground selection transistors TGS1 and TGS2, which may be connected to the first main string MS1 which may include the memory cell transistor TMn-2_2, may be turned on. Also, the second substring selection transistor TSI2, which may be connected to the second substring SS2 which may include the memory cell transistor TMn-2_2, may be turned on, and the first substring selection transistor TSI1, which may be connected to the first substring SS1 which may not include the memory cell transistor TMn-2_2, may be turned off.

Meanwhile, in order to inhibit programming of the second main string MS2, which may not include the memory cell transistor TMn-2_2, the first and second ground selection transistors TGS3 and TGS4, which may be connected to the second main string MS2, may be turned off.

The first main string MS1 may be selected and the second main string MS2 may not be selected by applying a Vcc to the bit line BL1, which may be connected to the main string MS1 including the memory cell transistor TMn-2_2, and applying a ground voltage to the bit line BL2, which may be connected to the main string MS2 which may not include the memory cell transistor TMn-2_2.

In this program mode, the ground voltage may be applied to the charge supply line CSL. Accordingly, the program operation may be performed by providing charges from the charge supply line CSL to the memory cell transistor TMn-2_2.

In the program mode, a program voltage Vpgm may be applied to the memory cell transistor TMn-2_2 and a pass voltage Vpass may be applied to the other memory cell transistors, for example other second memory cell TM1_2 through TM3_2, TMn-1_2, and TMn_2. The pass voltage Vpass may turn on a memory cell transistor and the program voltage Vpgm may be higher than the pass voltage Vpass.

Instead of the pass voltage Vpass, the ground voltage may be applied to the second memory cell transistors TMn-1_2 and TMn_2, which may not be disposed between the memory cell transistor TMn-2_2 and the second ground selection transistor TGS2, or the second memory cell transistors TMn-1_2 and TMn_2 may be floated.

Figure 6:
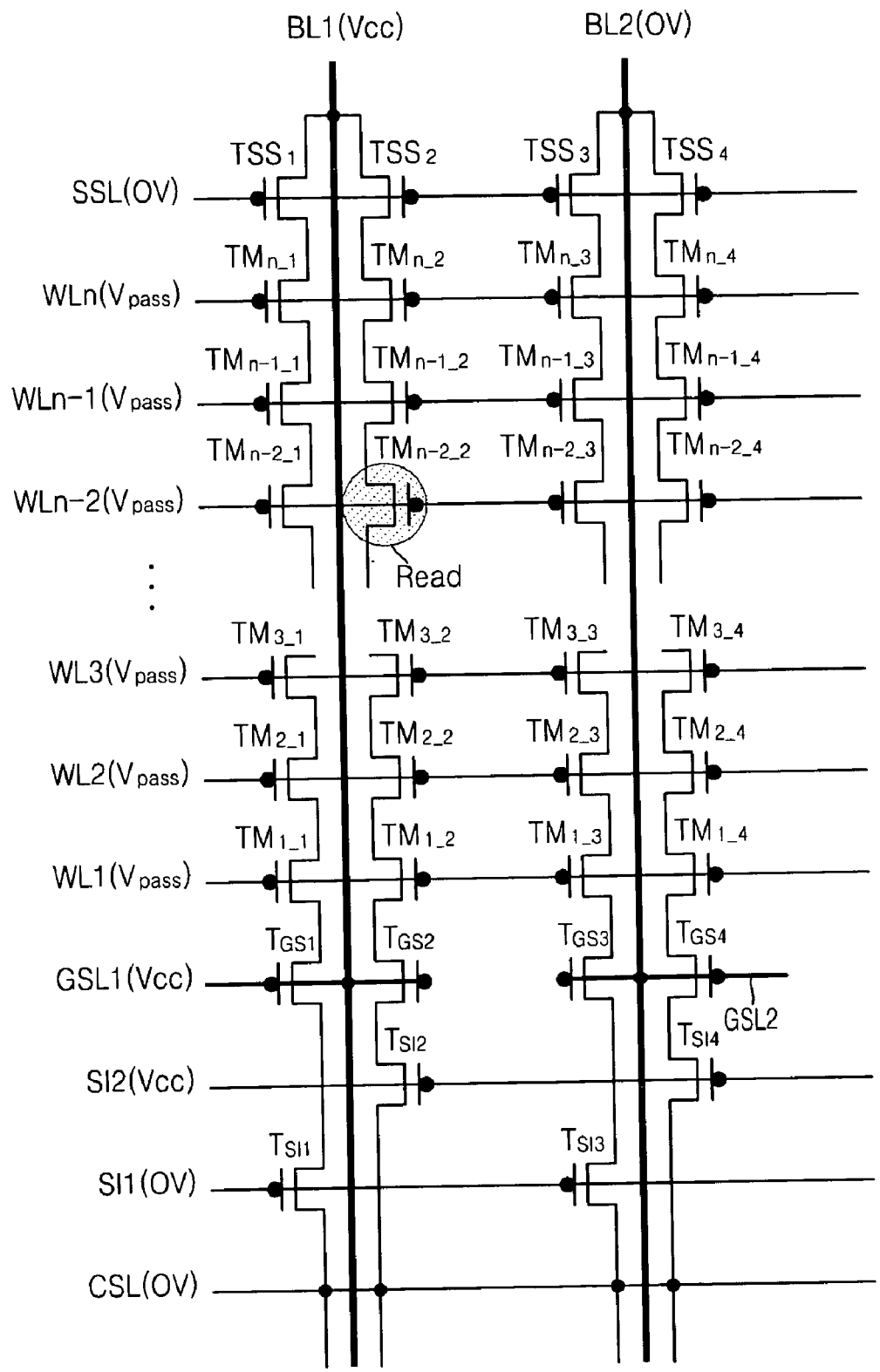
FIG. 6 is a circuit diagram for describing a read operation of the non-volatile memory device illustrated in FIG. 1, according to example embodiments.

FIG. 6 is a circuit diagram for describing a read operation of the non-volatile memory device illustrated in FIG. 1, according to example embodiments. FIG. 6 will be described in conjunction with FIG. 1.

In FIG. 6, it is assumed that a memory cell transistor TMn-2_2 is a target memory cell transistor to be read. In order to read the memory cell transistor TMn-2_2, the first and second ground selection transistors TGS1 and TGS2, which may be connected to the first main string MS1 including the memory cell transistor TMn-2_2, may be turned on, the second substring selection transistor TSI2, which may be connected to the second substring SS2 including the memory cell transistor TMn-2_2, may be turned on, and the first substring selection transistor TSI1, which may be connected to the first substring SS1 not including the memory cell transistor TMn-2_2m may be turned off.

In this read mode, a ground voltage may be applied to the charge supply line CSL. Also, a read voltage Vread may be applied to the memory cell transistor TMn-2_2 and a pass voltage Vpass may be applied to the other memory cell transistors, for example other second memory cell transistors TM1_2 through TM3_2, TMn-1_2, and TMn_2. The pass voltage Vpass may turn on a memory cell transistor and the read voltage Vread may turn on or off the memory cell transistor TMn-2_2 in accordance with a threshold voltage level of the memory cell transistor TMn-2_2.

In FIG. 1, the first ground selection transistor TGS1 may be disposed between the first substring selection transistor TSI1 and the first memory cell transistors TM1_1 through TMn_1. However, positions of the first ground selection transistor TGS1 and the first substring selection transistor TSI1 may be switched. That is, the first substring selection transistor TSI1 may be disposed between the first ground selection transistor TGS1 and the first memory cell transistors TM1_1 through TMn_1. If the positions of the first ground selection transistor TGS1 and the first substring selection transistor TSI1 are switched as described above, operations of the non-volatile memory device may correspond to the operations of the non-volatile memory device illustrated in FIG. 1. Thus, detailed descriptions thereof will be omitted.

As described above, according to example embodiments, a non-volatile memory device may perform a program operation and a read operation without using a channel boosting technology. Accordingly, damages of outermost memory cell transistors which occur when a high channel boosting voltage is used may be inhibited.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A non-volatile memory device comprising:
   one or more main strings each including first and second substrings separately including a plurality of memory cell transistors;
   a bit line; and
   a charge supply line configured to provide charges to or block charges from the first and second substrings of each of the main strings,
   wherein each of the main strings includes
   a first transistor connected to the first substring,
   a second transistor connected to the first transistor,
   a third transistor connected to the second substring, and
   a fourth transistor connected to the third transistor, and
   wherein the bit line is electrically connected to gates of at least one of the first and second transistors, and at least one of the third and fourth transistors.

2. The non-volatile memory device of claim 1, wherein
   the first transistor is a first ground selection transistor,
   the second transistor is a first substring selection transistor,
   the third transistor is a second ground selection transistor, and
   the fourth transistor is a second substring selection transistor.

3. The non-volatile memory device of claim 2, further comprising:
   a first substring selection line which is connected to a gate of the first substring selection transistor; and
   a second substring selection line which is connected to a gate of the second substring selection transistor.

4. The non-volatile memory device of claim 3, further comprising:
   a first dummy substring selection transistor which is connected between the first ground selection transistor and the first substring selection transistor, and includes a gate connected to the second substring selection line; and
   a second dummy substring selection transistor which is connected to the second substring selection transistor, and includes a gate connected to the first substring selection line.

5. The non-volatile memory device of claim 2, further comprising:
   a ground selection line which is connected to gates of the first and second ground selection transistors.

6. The non-volatile memory device of claim 5,
   wherein the ground selection line is connected to the bit line.

7. The non-volatile memory device of claim 2, wherein the bit line is shared by the first and second substrings of each of the main strings.

8. The non-volatile memory device of claim 2, wherein the charge supply line is a common source line.

9. The non-volatile memory device of claim 2, further comprising:
- a first string selection transistor which is connected to the first substring; and
- a second string selection transistor which is connected to the second substring.

10. The non-volatile memory device of claim 2, wherein source and drain regions are formed on a semiconductor substrate between memory cell transistors, from among the plurality of memory cell transistors, by fringe fields.

11. The non-volatile memory device of claim 10, wherein the fringe fields are formed by applying voltages to gates of memory cell transistors from among the plurality of memory cell transistors.

12. The non-volatile memory device of claim 2, wherein the first and second substrings form flash memory having a perpendicular structure.

13. The non-volatile memory device of claim 1, wherein
- the first transistor is a first substring selection transistor,
- the second transistor is a first ground selection transistor,
- the third transistor is a second substring selection transistor, and
- the fourth transistor is a second ground selection transistor.

14. The non-volatile memory device of claim 13, further comprising:
- a ground selection line which is connected to gates of the first and second ground selection transistors;
- a first substring selection line which is connected to a gate of the first substring selection transistor; and
- a second substring selection line which is connected to a gate of the second substring selection transistor.

15. A method of programming a target memory cell transistor of the non-volatile memory device of claim 1, the method comprising:
- turning on first and second ground selection transistors connected to a main string including the target memory cell transistor;
- turning on a substring selection transistor connected to a substring including the target memory cell transistor; and
- turning off another substring selection transistor connected to another substring not including the target memory cell transistor.

16. The method of claim 15, wherein third and fourth ground selection transistors connected to another main string not including target memory cell transistor are turned off in order to inhibit programming of the other main string.

17. The method of claim 15, wherein a ground voltage is applied to a charge supply line.

18. The method of claim 15, wherein a program voltage is applied to the target memory cell transistor and a pass voltage is applied to other memory cell transistors, and
- wherein the pass voltage turns on a memory cell transistor and the program voltage is higher than the pass voltage.

19. The method of claim 18, wherein a ground voltage is applied to memory cell transistors which are not disposed between the target memory cell transistor and the first or second ground selection transistors, or the memory cell transistors are floated.

20. A method of reading a target memory cell transistor of the non-volatile memory device of claim 1, the method comprising:
- turning on first and second ground selection transistors connected to a main string including the target memory cell transistor;
- turning on a substring selection transistor connected to a substring including the target memory cell transistor; and
- turning off another substring selection transistor connected to another substring not including the target memory cell transistor.

21. The method of claim 20, wherein a ground voltage is applied to a charge supply line.

22. The method of claim 20, wherein a read voltage is applied to the target memory cell transistor and a pass voltage is applied to other memory cell transistors, and
- wherein the pass voltage turns on a memory cell transistor and the read voltage turns on or off the target memory cell transistor in accordance with a threshold voltage level of the target memory cell transistor.

* * * * *